(12) United States Patent
Woo (10) Patent No.: US 9,842,746 B2
(45) Date of Patent: Dec. 12, 2017

(54) PURGE GAS SPRAYING PLATE AND FUME REMOVING APPARATUS HAVING THE SAME

(71) Applicant: Bum Je Woo, Seongnam-si (KR)

(72) Inventor: Bum Je Woo, Seongnam-si (KR)

( * ) Notice: Subject to any disclaimer, the term of this patent is extended or adjusted under 35 U.S.C. 154(b) by 227 days.

(21) Appl. No.: 14/725,257

(22) Filed: May 29, 2015

(65) Prior Publication Data

US 2016/0268148 A1 Sep. 15, 2016

(30) Foreign Application Priority Data

Mar. 10, 2015 (KR) ........................ 10-2015-0032922

(51) Int. Cl.
| | | |
|---|---|---|
| *C23C 16/00* | (2006.01) | |
| *H01L 21/67* | (2006.01) | |
| *H01L 21/673* | (2006.01) | |
| *H01L 21/677* | (2006.01) | |

(52) U.S. Cl.
CPC ...... *H01L 21/67017* (2013.01); *H01L 21/673* (2013.01); *H01L 21/6732* (2013.01); *H01L 21/67793* (2013.01)

(58) Field of Classification Search
CPC ........... H01L 21/67017; H01L 21/6732; H01L 21/673; H01L 21/32899; H01L 21/3244
USPC ...................................................... 118/728
See application file for complete search history.

(56) References Cited

U.S. PATENT DOCUMENTS

2009/0305612 A1* 12/2009 Miyazaki .............. B24B 37/345
451/11

FOREIGN PATENT DOCUMENTS

| JP | 0568925 | 3/1993 | |
|---|---|---|---|
| JP | 06275588 | 9/1994 | |
| JP | 2012-004199 | * 1/2012 | ........... H01L 21/673 |
| KR | 20030077803 | 10/2003 | |
| KR | 20090081471 | 7/2009 | |
| KR | 20140088406 | 7/2014 | |
| KR | 101444241 | 9/2014 | |

OTHER PUBLICATIONS

English translation JP 2012-004199, Yamagishi, Jan. 2012.*
Korean Office Action—Korean Application No. 10-2015-0032922 dated Mar. 3, 2016, citing KR 10-1444241, JP 05-068925, KR 10-2014-0088406, KR 10-2003-0077803, JP 06-275588 and KR 10-2009-0081471.

* cited by examiner

*Primary Examiner* — Keath Chen
(74) *Attorney, Agent, or Firm* — Cantor Colburn LLP (57) ABSTRACT

Provided are a purge gas spraying plate and a fume removing apparatus, and more particularly, a purge gas spraying plate capable of spraying a purge gas, which sprays the purge gas along a curvature of a wafer and efficiently removes fumes remaining on the wafer because a concave portion is formed at one side thereof and a spraying hole and a support member configured to support the wafer are formed in the concave portion, and a fume removing apparatus having the same.

22 Claims, 11 Drawing Sheets

Fig. 1

*Prior Art*

Fig. 2

*Prior Art*

PURGE GAS SPRAYING PLATE AND FUME REMOVING APPARATUS HAVING THE SAME

BACKGROUND

1. Technical Field

The present invention relates to a purge gas spraying plate and a fume removing apparatus having the same, and more particularly, to a purge gas spraying plate which effectively removes fumes by spraying a purge gas and a fume removing apparatus having the same.

2. Description of the Related Art

Generally, semiconductor devices are manufactured by depositing thin films for performing various functions on upper surfaces of the wafer, and patterning the thin film to form various circuit geometries.

Unit processes for manufacturing the semiconductor devices can be mainly divided into an impurity ion implantation process by which impurities such as group 3B elements or group 5B elements are implanted into an inside of the semiconductor, a thin film deposition process which forms material films on a semiconductor substrate, an etching process which forms a predetermined patterns using the material films, a planarization process such as a chemical mechanical polishing (CMP) process which removes step differences by polishing a surface of a wafer in a lump after depositing interlayer insulating films and the like on an upper surface of the wafer, and a cleaning process for removing residues.

Meanwhile, wafers on which the predetermined process described above is completed are not transferred as an individual wafer, but are transferred as a batch of 20 to 25 wafers, which are seated in a cassette. At this time, the wafers on which process gases used for the process and fumes which are by-products of the process are not removed and remain on surfaces of the wafers are seated in the cassette.

However, the residues described above causes the contamination of a semiconductor manufacturing apparatus and defects of etch patterns when a subsequent process is performed in a state in which the residues are attached to the surfaces of the wafers. As a result, since the reliability of a device is decreased, many techniques have been developed to remove the residues.

As described above, a conventional fume removing apparatus for removing fumes remaining on surfaces of wafers is disclosed in Korean Patent Application No. 1444241.

Figure 1:
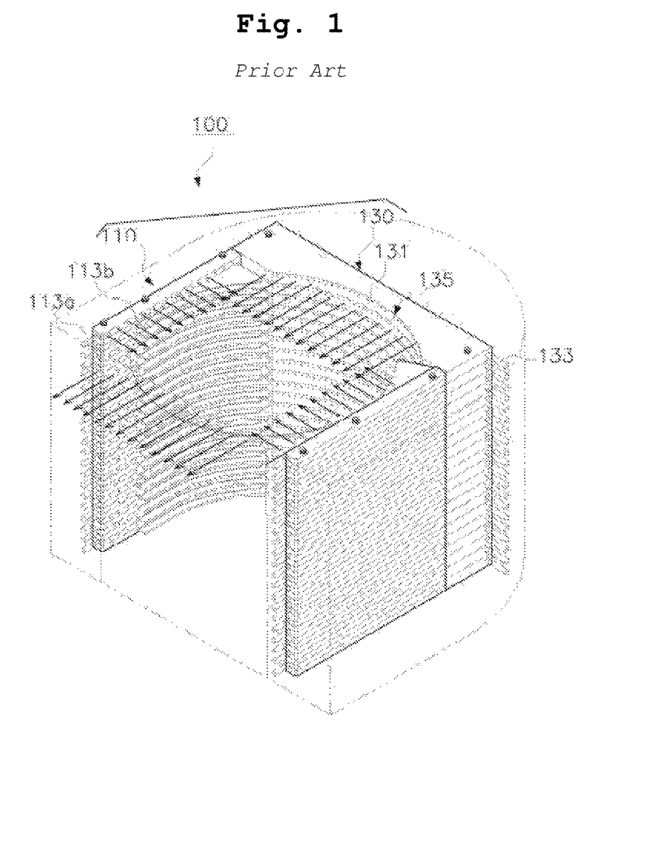
FIG. 1 is a perspective view illustrating a conventional fume removing apparatus.
Figure 2:
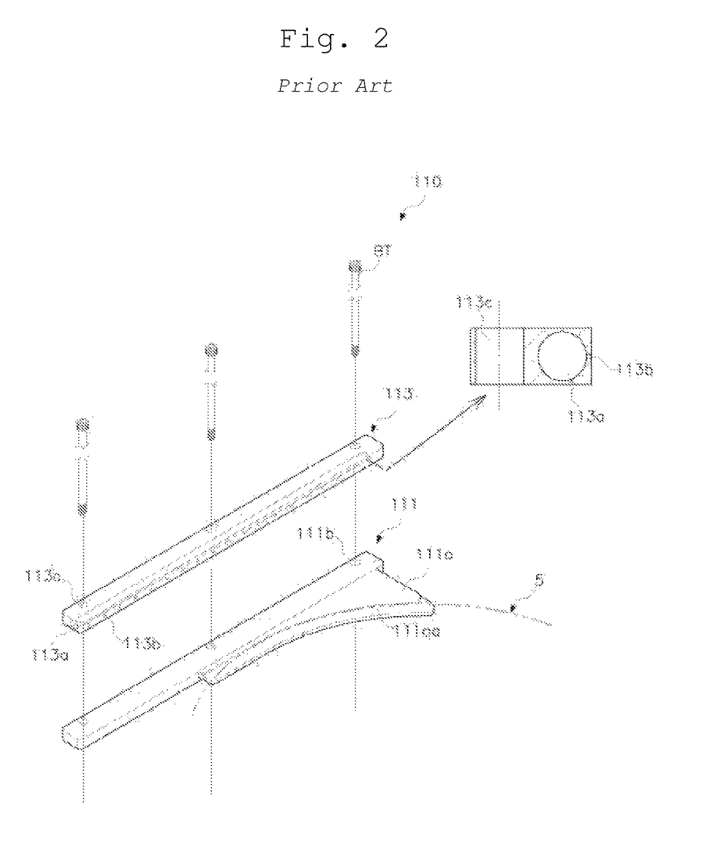
FIG. 2 is an exploded perspective view illustrating a wafer support member and a spacer in FIG. 1.

As illustrated in FIGS. 1 and 2, a cleaning apparatus 100 as a conventional fume removing apparatus is formed with a side cleaning apparatus 110 and a rear cleaning apparatus 130.

The side cleaning apparatus 110 includes wafer support members 111 and spacers 113.

The wafer support members 111 are each provided with a rib 111a and through holes 111b.

The rib 111a includes a step 111aa at an edge thereof to easily seat a wafer 5 inserted from one side thereof.

The plurality of through holes 111b are formed at equidistant intervals in a longitudinal direction to be easily coupled with a plurality of spacers 113, which will be described below using bolts BT.

The spacer 113 is provided on an upper side of the wafer support member 111.

The spacer 113 formed in a bar shape having a cross-sectional rectangular shape is provided with an inlet 113a in a longitudinal direction of one side thereof so that a purge gas sprayed from a pneumatic block flows in, and a plurality of spraying holes 113b at equidistant intervals in a direction perpendicular to a side of the inlet 113a.

The inlet 113a described above is directly connected to an outlet of the pneumatic block to enable a purge gas (N2 gas) to be individually sprayed through only the spraying holes 113b corresponding to a portion at which a wafer 5 is provided.

Through holes 113c are formed at locations respectively the same as the centers of the through holes 111b of the wafer support member 111 at equidistant intervals in a longitudinal direction of the spacer 113 to be easily coupled therewith using bolts.

As described above, a configuration of one set having the wafer support member 111 and the spacer 113 is vertically repeated as a plurality, and thus, it is possible to clean a plurality of stacked wafers 5.

In addition, the rear cleaning apparatus 130 is provided at one end of the side cleaning apparatus 110 in a rear direction, i.e., based on a direction illustrated in FIG. 1.

The rear cleaning apparatus 130 has a plurality of spraying holes 131, which are stacked and provided at a rear of the side cleaning apparatus 110 in a direction perpendicular thereto and formed at the same levels as the spraying holes 113b of the spacer 113, at equidistant intervals in a longitudinal direction.

However, since a conventional fume removing apparatus is manufactured by separately manufacturing a wafer support member 111 which supports a wafer and a spacer 113, and installing a plurality of configurations of which one set includes the wafer support member 111 and the spacer 113 sequentially stacked at an inner side of the fume removing apparatus, there are problems in that a structure of the inside thereof is complex and the cost of manufacturing equipment is increased.

In addition, since the spraying holes 113b of the spacer 113 are formed to be only disposed linearly without considering a circular shape of a wafer, there is an area having a big gap between the spraying holes 113b and the circumference of the wafer, and thus, a dead zone in which fumes remaining on the wafer cannot be removed may be generated.

In addition, since a wafer is seated on a step 111aa of the rib 111a of the wafer support member 111, there is a problem in that a contact area in which the wafer and the step 111aa are in contact with each other is increased which can cause damage to the wafer.

SUMMARY

The present invention is directed to a purge gas spraying plate which sprays a purge gas along a curvature of a wafer and effectively removes fumes remaining on the wafer, and a fume removing apparatus having the same.

In accordance with one aspect of the present invention, a purge gas spraying plate includes a plate including a concave portion formed at one side thereof, an inlet formed in the plate, a flow path which communicates with the inlet and is formed inside the plate, and a spraying hole which communicates with the flow path and is formed in the concave portion.

In addition, the plate may be formed by assembling a first plate and a second plate formed in the same appearance as that of the first plate, and the flow path is formed in at least any one of surfaces of the first plate and the second plate which are coupled.

In addition, the spraying hole may spray a purge gas in a direction of a downward slope.

In addition, the purge gas spraying plate may further include a front portion configured to extend from an end portion of the concave portion, and the spraying hole may be formed in plural number and at least one of the plurality of spraying holes are formed in the front portion.

In addition, a support member configured to support a wafer may be formed on the plate.

In addition, the support member may be formed on the concave portion.

In addition, the flow path may include a main flow path through which a gas introduced from the inlet flows, and a plurality of branch flow paths branched from the main flow path, and the plurality of branch flow paths respectively may communicate with the plurality of spraying holes.

In addition, a cross-sectional area of the main flow path may be greater than that of each of the plurality of branch flow paths.

In addition, a cross-sectional area of a branch flow path close to the inlet among the plurality of branch flow paths may be smaller than that of a branch flow path farthest away from the inlet.

In addition, at least one obtuse angle may be formed between the main flow path and the plurality of branch flow paths based on a direction in which the purge gas flows.

In addition, a branch flow path farthest away from the inlet among the plurality of branch flow paths and the main flow path may form an obtuse angle based on a direction in which the purge gas flows.

In addition, the plate may be formed by assembling a first metal plate and a second metal plate formed in the same appearance as that of the first metal plate, and the flow path may be formed in at least any one of surfaces of the first metal plate and the second metal plate which are coupled, and an anodic oxide film may be formed on the surfaces of the first metal plate and the second metal plate.

In addition, the plate may be made of aluminum, and the anodic oxide film is an anodized layer formed by anodizing the aluminum.

In addition the concave portion may be formed in a circular arc shape.

In addition, the purge gas spraying plate may further include a coupling member configured to couple the first plate and the second plate, and an insulating film adhered on an upper surface of the coupling member.

In addition, a fluoro-based resin coating layer may be formed on the plate.

In accordance with another aspect of the present invention, a fume removing apparatus which removes fumes by spraying a purge gas on a wafer seated therein includes a purge gas spraying plate configured to spray a purge gas on the wafer, and the purge gas spraying plate includes a plate including a concave portion formed at one side thereof, an inlet formed in the plate, a flow path which communicates with the inlet and is formed in the plate, and a spraying hole which communicates with the flow path and is formed in the concave portion.

In accordance with yet another aspect of the present invention, a fume removing apparatus which removes fumes by spraying a purge gas on a wafer seated therein includes a purge gas spraying plate configured to spray a purge gas, and the purge gas spraying plate includes a plate including one side having a circular arc shape, an inlet formed in the plate, a flow path which communicates with the inlet and is formed in the plate, a spraying hole which communicates with the flow path and is formed in the one side, and a support member including one end coupled to one side and the other end configured to support the wafer, and the spraying hole sprays a purge gas to the wafer in a state in which the spraying hole is spaced apart from the wafer.

In accordance with still another aspect of the present invention, a fume removing apparatus which removes fumes by spraying a purge gas on a wafer seated therein includes a support member configured to support the wafer, a purge gas spraying plate including a concave portion formed on one side of the purge gas spraying plate configured to extend from an inner wall of the fume removing apparatus and horizontally installed with the wafer, an inlet formed in the purge gas spraying plate, a flow path which communicates with the inlet and is formed in the purge gas spraying plate, and a spraying hole which communicates with the flow path and is formed in the concave portion, and the purge gas spraying plate is formed in plural number, and the plurality of purge gas spraying plates are vertically installed in the fume removing apparatus.

In addition, an intermediate member may be interposed between the plurality of purge gas spraying plates vertically installed.

In addition, the plurality of purge gas spraying plates may be formed to have longer lengths than that of the intermediate member, and a clearance portion, which is a gap between the plurality of purge gas spraying plates disposed vertically, is formed.

In addition, a through hole may be formed in the purge gas spraying plate, and a heater rod is inserted in the through hole.

In addition, the purge gas spraying plate may be formed in front of the wafer, and an exhaust configured to exhaust the purge gas is formed at the rear of the wafer.

As described above, according to the purge gas spraying plate and the fume removing apparatus having the same of embodiments of the present invention, the provided effects as follows.

Since an inlet, a flow path in communication with the inlet, and a spraying hole in communication with the flow path are formed in the plate of the purge gas spraying plate to spray a purge gas, the design thereof is simplified compared to that of a conventional fume removing apparatus in which a spraying portion and a support are separately manufactured, and thus, compactness of the fume removing apparatus can be achieved.

Since the flow path of the purge gas spraying plate includes a main flow path in which a purge gas introduced from the inlet flows and a plurality of branch flow paths in communication with the main flow path, and cross-sectional areas of the main flow path and the branch flow paths can be controlled, or angles formed by the main flow path and the branch flow paths can be controlled, the amount and flow rate of a sprayed purge gas can be controlled to reduce the amount of the purge gas used for removing fumes.

Since a concave portion having a circular arc shape is formed at one side of the plate, and a support member configured to support a wafer is formed at the concave portion, when the wafer is moved into the fume removing apparatus having the purge gas spraying plate, the wafer can be seated on the support member formed on the concave portion having the circular arc shape to be fixed stably, and since the support member is made of a support rod, a contact area of the wafer and the support member can be minimized to prevent the wafer from being damaged.

In addition, since the spraying hole is formed in the concave portion having the circular arc shape, when the fumes remaining on the wafer are removed, a purge gas introduced through the flow path is sprayed along the concave portion having the circular arc shape with the same curvature as that of the wafer, and since the purge gas thereof is sprayed closer to the wafer compared to that of a conventional fume removing apparatus, a dead zone in which fumes are not removed is not generated, and fumes remaining on the wafer can be also effectively removed using an even smaller amount of the purge gas.

In addition, since a front portion which continues from an end portion of the concave portion is formed, a robot arm which loads a wafer can be prevented from being interfered with by the plate, and since a spraying hole is formed at the front portion and sprays a purge gas on a front portion of the wafer, fumes remaining on a surface of the wafer can be removed by a purge gas sprayed from the spraying hole formed in the concave portion without a dead zone.

Since a purge gas sprayed from the spraying hole is sprayed in a direction of a downward slope, the amount of the sprayed purge gas can be increased in a wafer direction to effectively remove the fumes remaining on a surface of the wafer.

In addition, even when a wafer supported by a purge gas spraying plate just below each purge gas spraying plate is not presented, since a purge gas sprayed from the first to fourth spraying holes is sprayed in a direction of a downward slope, the purge gas may be more effectively sprayed to the seated wafer to more effectively remove fumes remaining on a surface of the wafer.

Since the plate is formed by assembling a metal plate and a second plate formed in the same appearance as that of the first plate, and the flow path is formed in at least of the first plate and second plates at which the first plate and the second plate are coupled, the flow path can be further precisely manufactured in the plate.

In addition, since the first and second plates and the plate are made of aluminum, it can help the manufacturing of the flow path and a structure of the flow path to be easy and precise, and manufacturing costs can be inexpensive.

In addition, since an anodized layer is formed by anodizing a first plate and a second plate formed of aluminum, unlike a plate formed as a single, the anodized layer can be formed on the flow path formed in one of the first and second plates, and even when a small amount of fume gas flows in the flow path, the flow path can be prevented from corroding or deforming or the like.

In addition, since an insulating film is adhered on upper sides of coupling members configured to couple the first plate and the second plate, and a fluoro-based resin coating layer is formed on the plate in which the first plate and the second plate are coupled, a coupling portion generated by coupling the first plate and the second plate is coated with the fluoro-based resin coating layer can prevent a purge gas from being leaked through the coupling portion of the flow path when the purge gas flows in the flow path formed at any one of the first plate or the second plate.

In the fume removing apparatus including the purge gas spraying plate described above, since the purge gas spraying plate includes a plurality of purge gas spraying plates and the plurality of purge gas spraying plates are vertically installed, and intermediate member having a length shorter than that of the plurality of purge gas spraying plates is interposed between the plurality of purge gas spraying plates formed to form a clearance portion by which the purge gas spraying plates are spaced from each other, a wafer can be easily loaded into and unloaded from an inside of the fume removing apparatus.

In addition, since a heater rod is inserted in the purge gas spraying plate, the humidity of an inside of the fume removing apparatus can be removed, and since a purge gas which flows inside the purge gas spraying plate is heated, the fume removing apparatus can easily spray the purge gas.

In addition, since a spacing structure having the clearance portion of the intermediate member and the purge gas sprayings has a heat sink shape, the thermal conductivity thereof can be high, and since the spacing structure can be easily cooled after heating by the heater rod is completed, the temperature of the inside of the fume removing apparatus can be easily controlled.

DETAILED DESCRIPTION OF EMBODIMENTS

Hereinafter, exemplary embodiments of the invention will be described in detail with reference to the accompanying drawings.

Figure 3:
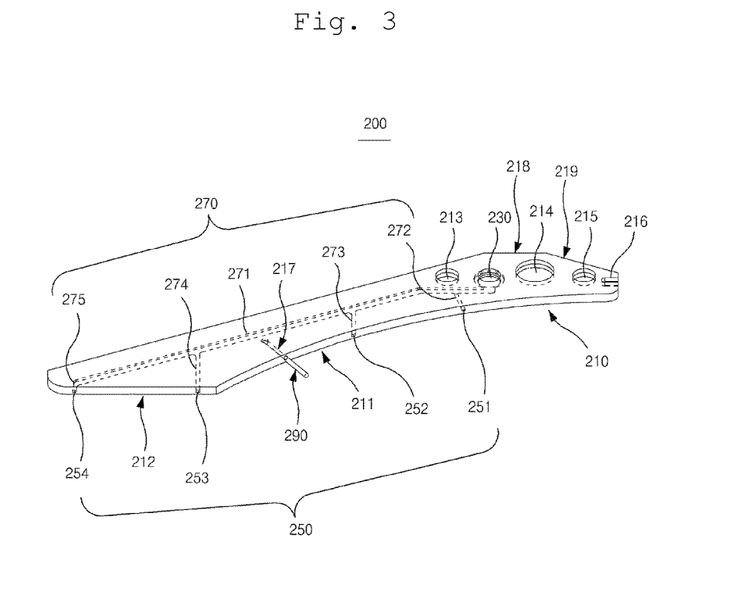
FIG. 3 is a perspective view illustrating a purge gas spraying plate according to a first embodiment of the present invention.
Figure 4:
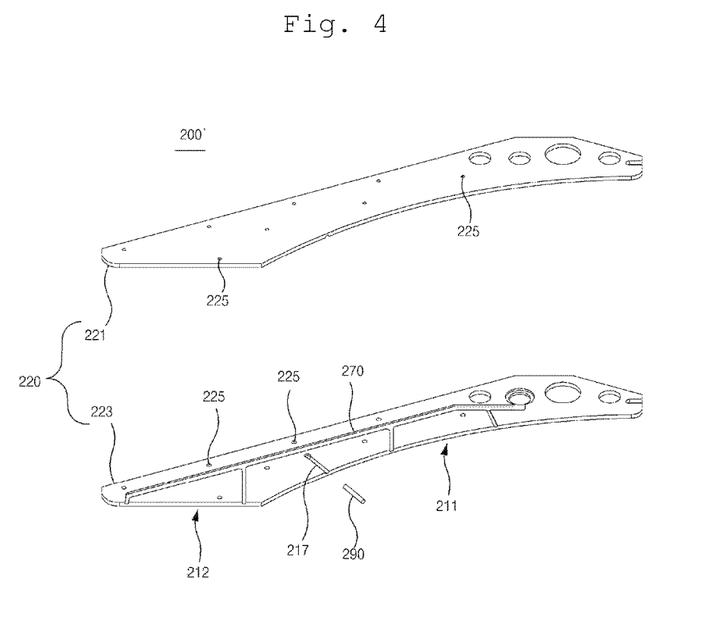
FIG. 4 is a perspective view illustrating a purge gas spraying plate according to a second embodiment of the present invention.
Figure 5:
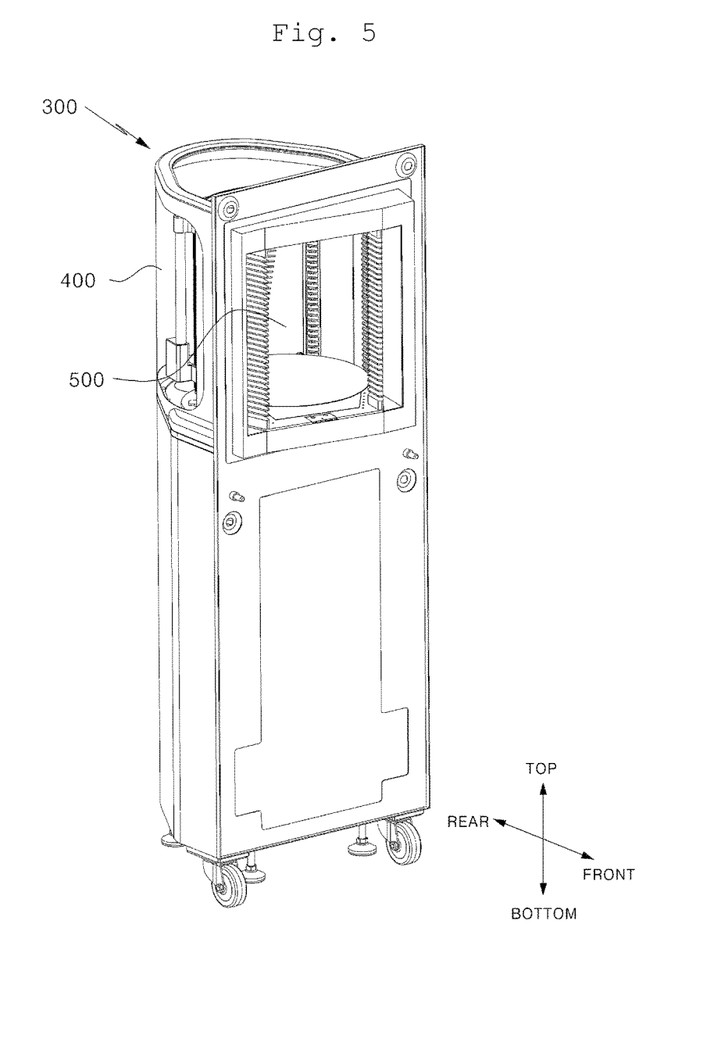
FIG. 5 is a perspective view illustrating a fume removing apparatus according to an embodiment of the present invention.
Figure 6:
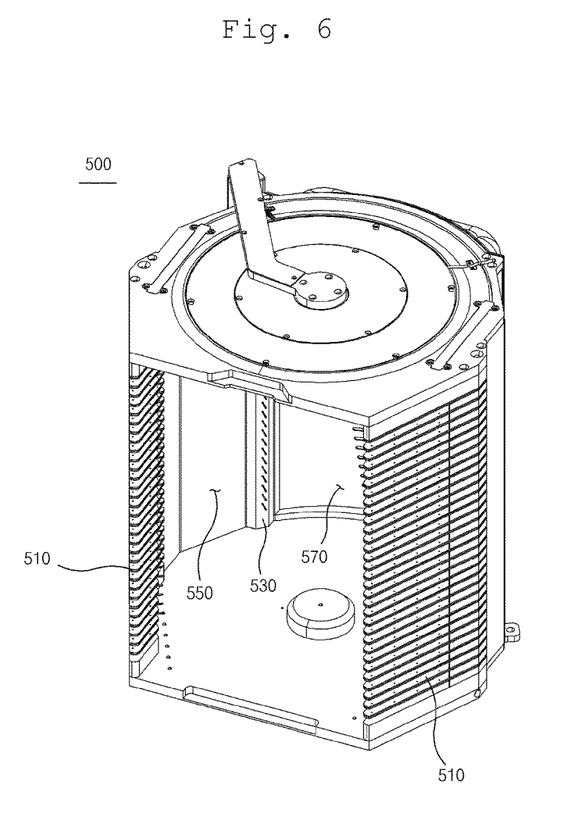
FIG. 6 is a perspective view illustrating a wafer cassette in FIG. 5.
Figure 7A:
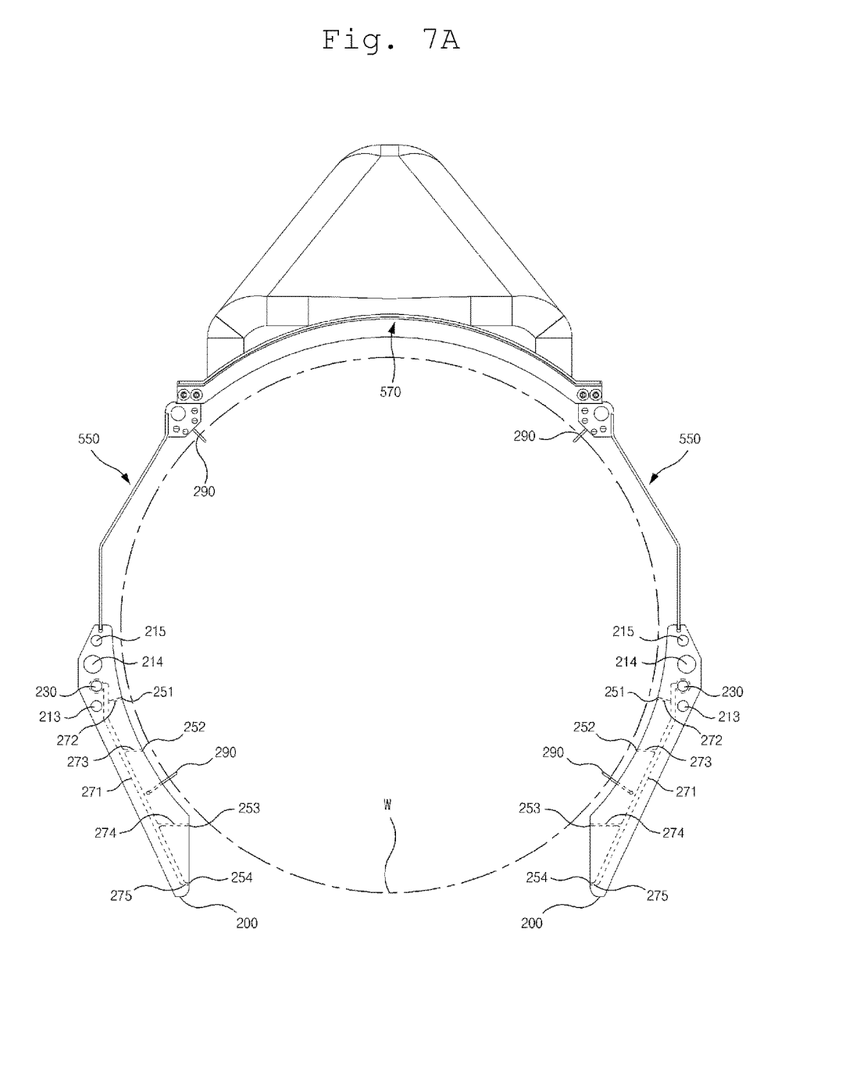
FIGS. 7A and 7B are cross-sectional plan views of FIG. 6 seen from above.
Figure 7B:
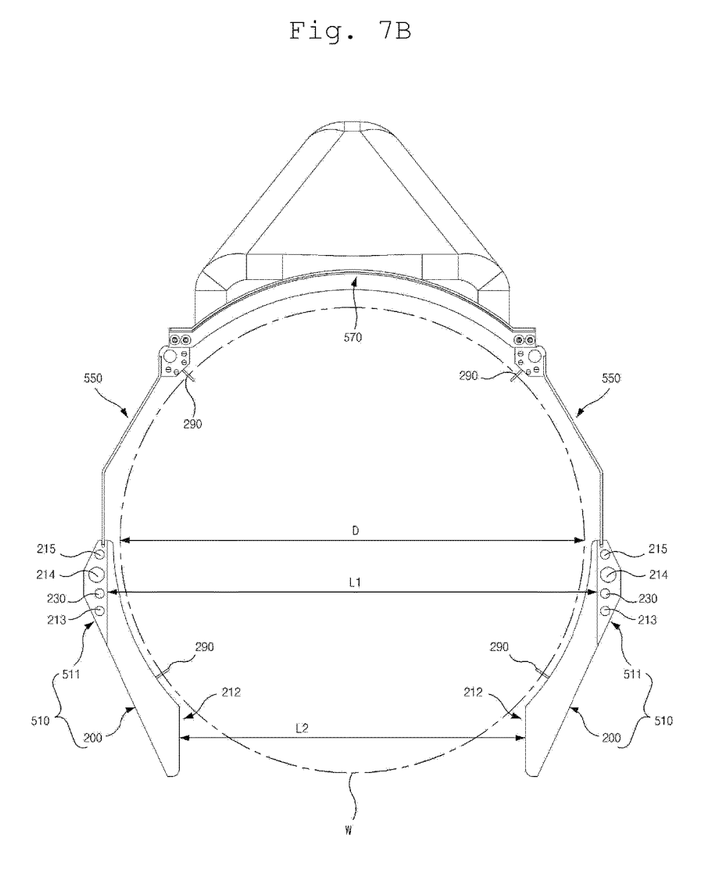
Figure 8:
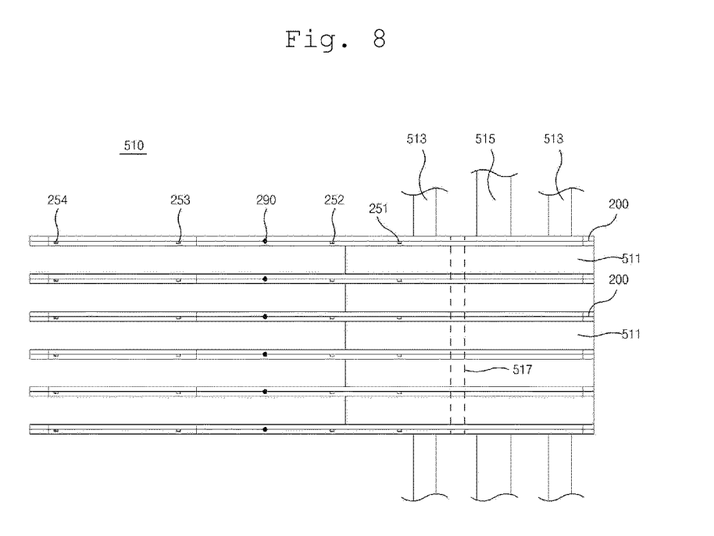
FIG. 8 is an enlarged side view illustrating a first wafer accommodating portion in FIG. 6.
Figure 9:
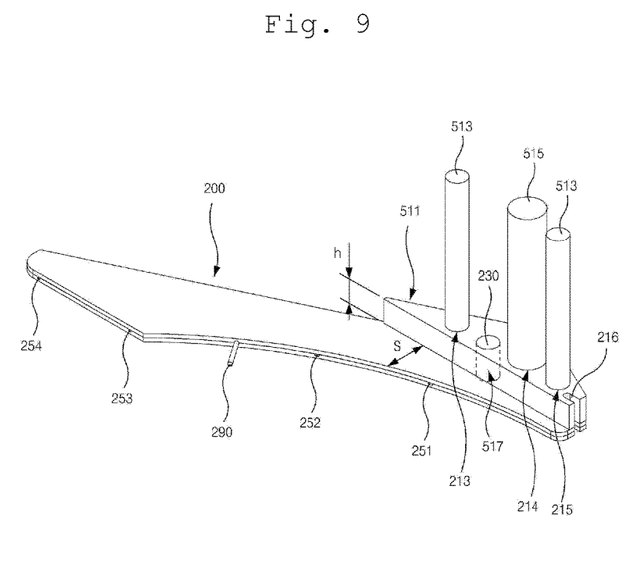
FIG. 9 is a perspective view illustrating a coupling state of a purge gas spraying plate and an intermediate member in FIG. 8.
Figure 10:
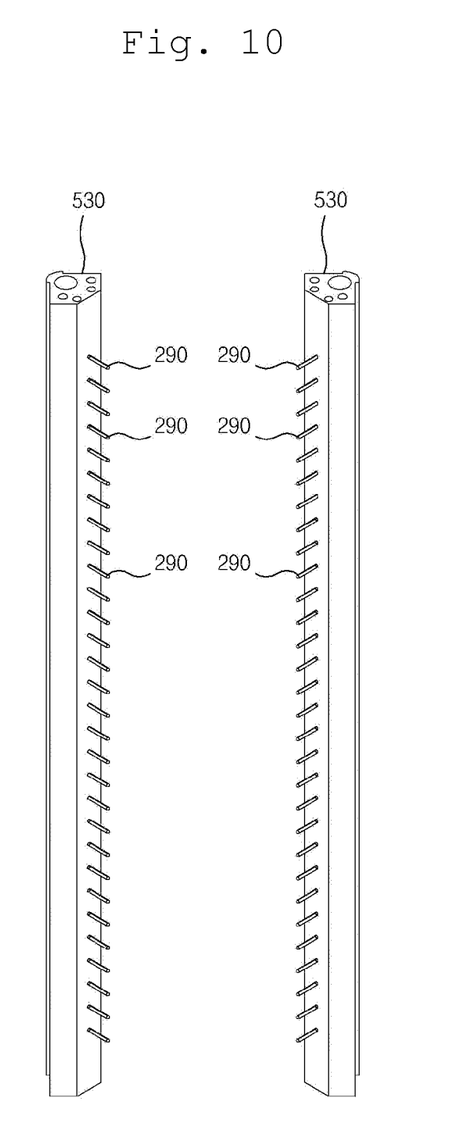
FIG. 10 is an enlarged perspective view illustrating a second wafer accommodating portion in FIG. 6.

FIG. 3 is a perspective view illustrating a purge gas spraying plate according to a first embodiment of the present invention, FIG. 4 is a perspective view illustrating a purge gas spraying plate according to a second embodiment of the present invention, FIG. 5 is a perspective view illustrating a fume removing apparatus according to an embodiment of the present invention, FIG. 6 is a perspective view illustrating a wafer cassette in FIG. 5, FIGS. 7A and 7B are cross-sectional plan views of FIG. 6 seen from above, FIG. 8 is an enlarged side view illustrating a first wafer accommodating portion in FIG. 6, FIG. 9 is a perspective view illustrating a coupling state of a purge gas spraying plate and an intermediate member in FIG. 8, and FIG. 10 is an enlarged perspective view illustrating a second wafer accommodating portion in FIG. 6.

As illustrated in FIG. 3, a purge gas spraying plate 200 according to a first embodiment of the present invention includes a plate 210, an inlet 230 in which a purge gas flows, spraying holes 250 configured to spray the purge gas, a flow path 270 in which the inlet 230 and the spraying holes 250 communicate with each other, and a support rod 290 configured to support a wafer.

The plate 210 includes a concave portion 211 formed in a circular arc shape at one side facing a wafer, and a front portion 212 continuously formed from a front end portion of the concave portion 211 and having a width decreasing toward a front of the plate 210.

The other side of the plate 210 includes a first inclined surface 218 having a slope around the inlet 230 in the concave portion 211 direction while linearly continuing from a front end portion of the front portion 212 to a rear end of the plate 210, and a second inclined surface 219 continuing from the first inclined surface 218, having a slope around a second through hole 214 in the direction of concave portion 211, and continuing to a coupling groove 216.

At the rear end of the plate 210, the inlet 230, first to third through holes 213 to 215 are formed to pass through a top surface and a bottom surface of the plate 210, and the coupling groove 216 is formed in a rear end portion of the plate 210.

The curvature of the concave portion 211 having the circular arc shape is the same as a curvature of the wafer, and a support rod insertion hole 217 is formed in one side of the concave portion 211, and a support rod 290 which supports the wafer is provided by being inserted into the support rod insertion hole 217.

Thus, since the wafer having the same curvature as the circular arc shape of the concave portion 211 is seated on the support rod 290, the wafer is supported at a close location along the curvature of the concave portion 211, and since a contact area of the support rod 290 with the wafer is minimized, the damage to the wafer may be prevented.

In addition, the wafer may be seated on and supported by an upper surface of the concave portion 211 having the circular arc shape, and in this case, there is an advantage in which the wafer may be supported without installing an additional member such as the support rod 290.

As well as the concave portion 211 being formed in the circular arc shape, the concave portion 211 may be formed in a "<" shape.

Since the width of the front portion 212 decreases toward the front of the plate 210, when a robot arm (not shown) seats the wafer on the support rod 290, the front portion 212 prevents the robot arm from being interfered with by the plate 210.

The first to third through holes 213 to 215 are also formed at an intermediate member 511 to be described below, coupling rods 513 are respectively inserted into the first through hole 213 and the third through hole 215, and a heater rod 515 is inserted into the second through hole 214.

A coupling groove 216 is also formed at the intermediate member 511 to be described below, a panel 550 is inserted into and coupled to the coupling groove 216.

The inlet 230 is formed by passing through the top surfaces and the bottom surfaces at rear ends of the plate 210 similar to the first to third through holes 213 to 215 described above.

The inlet 230 enables a purge gas supplied from a purge gas supplier of a main body 400 to be described below to flow into the flow path 270, and forms an inflow path 517 by communicating with an inlet 230 formed in the intermediate member 511, and this will be described below in detail.

The spraying holes 250 includes a first spraying hole 251 and a second spraying hole 252 formed in the concave portion 211 of the plate 210, and a third spraying hole 253 and a fourth spraying hole 254 formed at the front portion 212 thereof.

The flow path 270 is formed inside the plate 210, and includes a main flow path 271, first to fourth branch flow paths 272 to 275 branched from the main flow path 271.

The main flow path 271 enables a gas introduced from the inlet 230 to flow to the first to fourth branch flow paths 272 to 275.

Thus, the purge gas is supplied from a bottom side of the plate 210 and flows through the main flow path 271 from the rear to the front.

One ends of the first branch flow path 272 and the second branch flow path 273 communicate with the main flow path 271, and the other ends thereof respectively communicate with the first spraying hole 251 and the second spraying hole 252 formed at the concave portion 211.

In addition, one ends of the third branch flow path 274 and the fourth branch flow path 275 communicate with the main flow path 271, and the other ends thereof respectively communicate with the third spraying hole 253 and the fourth spraying hole 254 formed at the front portion 212.

That is, the first branch flow path 272, the second branch flow path 273, the third branch flow path 274, and the fourth branch flow path 275 each communicate with the main flow path 271 sequentially from the rear end to the front end of the plate 210.

In this case, the first to fourth branch flow paths 272 to 275 may be formed to be inclined downward to have a slope so that a purge gas sprayed from the first to fourth spraying holes 251 to 254 is sprayed in a direction of a downward slope.

A cross-sectional area of the main flow path 271 is greater than that of each of the first to fourth branch flow paths 272 to 275. Thus, a purge gas may easily flow from the main flow path 271 in the first to fourth branch flow paths 272 to 275 directions to be respectively discharged to the first to fourth spraying holes 251 to 254 due to the cross-sectional areas differences between the main flow path 271 and each of the first to fourth branch flow paths 272 to 275.

In addition, the cross-sectional areas of the first branch flow path 272 and the first spraying hole 251 most adjacent to the inlet 230 may be smaller than those of the fourth branch flow path 275 and the fourth spraying hole 254, and thus, it is possible to enable an amount of purge gas discharged from the fourth spraying hole 254 to be increased and to enable an amount of purge gas discharged from the first spraying hole 251 to be decreased.

As illustrated in FIGS. 7A and 7B, when a purge gas is sprayed to a wafer W to remove fumes remaining on the wafer W, the above difference in cross-sectional areas causes an amount of purge gas sprayed at a front end of a wafer cassette 500 to be increased and an amount of purge gas sprayed at a rear end thereof to be decreased to help the purge gas discharged flow easily to an exhaust 570.

In addition, in the case of the purge gas discharged from the first spraying hole 251 close to the exhaust 570, since the purge gas is exhausted through the exhaust 570 just after being sprayed, time to remove fumes of the wafer W is comparatively shorter than that of the purge gas discharged from the fourth spraying hole 254.

Thus, the amount of purge gas sprayed from the first spraying hole 251 is decreased and the amount of purge gas sprayed from the fourth spraying hole 254 farthest away from the exhaust 570 is increased to effectively remove fumes remaining on the wafer and reduce the amount of purge gas used.

The first branch flow path 272 close to the gas inlet 230 and the main flow path 271 form an acute angle based on a direction in which the purge gas flows therein, and the second to fourth branch flow paths 273 to 275 comparatively far from the inlet 230 and the main flow path 271 form an obtuse angle based on a direction in which the purge gas flows therein.

When the main flow path 271 and the branch flow paths form an acute or right angle, since the branch flow paths are formed in a direction opposite to a direction in which a purge gas flows, a smaller amount of purge gas is sprayed.

When the main flow path 271 and the branch flow paths form an obtuse angle, since the branch flow paths are formed in a direction in which a purge gas flows, a larger amount of purge gas is sprayed.

Thus, since an amount of purge gas sprayed from the first branch flow path 272 formed in an acute angle to the main flow path 271 is smaller than that of the second to fourth branch flow paths 273 to 275 formed in obtuse angles to the main flow path 271, even when the purge gas supplier of the main body 400 supplies a purge gas using a low pressure, the purge gas may easily flow to the fourth branch flow path 275 farthest away from the inlet 230.

Even when four branch flow paths, that is, the first to fourth branch flow paths 272 to 275 are described as an example, the number thereof can be unlimited without departing from the spirit and the scope of the present invention.

As illustrated in FIG. 4, a purge gas spraying plate 200' according to a second embodiment of the present invention may be configured by a plate 220 of the purge gas spraying plate 200' being formed by vertically coupling a first plate 221 and a second plate 223 having the same appearance as that of the first plate 221.

In this case, the purge gas spraying plate 200' has the same configuration and effect as those of the purge gas spraying plate 200 according to the first embodiment of the present invention except the plate 220 formed by vertically coupling the first plate 221 and the second plate 223, and thus, a description about the duplicated configuration will be omitted.

While the first plate 221 includes a support rod insertion hole 217 in which a support rod 290 configured to support a wafer and formed in the bottom surface of a concave portion 211, it does not include a flow path 270 unlike the second plate 223 to be described below.

In addition, the flow path 270 and the support rod insertion hole 217 in which the support rod 290 is inserted are formed in the top surface of the second plate 223, that is, surface in which the first plate 221 and the second plate 223 are coupled to each other.

However, the flow path 270 may be also formed in the bottom surface of the first plate 22 rather than the second plate 223.

A coupling member which couples the first plate 221 and the second plate 223 may be a bolt, and in this case, a plurality of bolt holes 225 are formed in the first plate 221 and the second plate 223.

In addition, it is preferable to adhere an insulating film (not shown) on the top surface of the bolt after coupling the first plate 221 and the second plate 223.

The bolt may be prevented from becoming loose, and the gap may be prevented from not being coated when coating with a fluoro-based resin to be described below by adhering the insulating films.

In addition, the fluoro-based resin coating may be performed easily and an aesthetic impression may be also secured by the insulating film blocking the gap.

It is preferable that the insulating film be formed of a polyimide film.

The polyimide film is, unlike a general film, has an excellent insulating property, thermal resistance, and chemical resistance, and thus, the fume removing apparatus is not deformed even when used for a long time.

In addition, it is possible to use the Kapton® film which is generally used by a general engineer as a polyimide-based film.

The first plate 221 and the second plate 223 are coupled using the bolts as coupling members, however, they may be also coupled using a welding method or an adhesive.

It is preferable that the first plate 221 and the second plate 223 configured to form the plate 210 according to the first embodiment of the present invention or the plate 220 according to the second embodiment of the present invention be a metal.

This is because a metal has a stronger flexural strength than a plastic and the like to be able to stably support a wafer when the purge gas spraying plates 200 and 222' according to the first and second embodiments of the present invention are formed in a cantilever shape, and the metal also has a higher thermal conductivity than the plastic and the like to better able to heat an inside of the wafer cassette 500 when a heater rod 515 to be described below is inserted.

In addition, particularly, aluminum is preferable among the metals described above, and that is because aluminum causes the manufacturing of the flow path 270 formed inside the plate 210 according to the first embodiment of the present invention and the flow path 270 formed in the second plate 223 to become easy.

In addition, the chemical resistance and the thermal resistance of the purge gas spraying plates 200 and 200' may be increased by forming an anodized layer by anodizing the aluminum.

In the case of the second embodiment of the present invention, since the plate 220 is formed by coupling the first plate 221 and the second plate 223, and the first and second plates 221 and 223 are anodized before being coupled, even when an amount of fume gas flows through the flow path 270 for a long time, the flow path may be prevented from corroding or deforming and the like.

In addition, in the case of the second embodiment of the present invention, it is preferable to coat the entire purge gas spraying plate 220 with a fluoro-based resin after coupling of the first plate 221 and the second plate 223.

The fluoro-based resin used for the fluoro-based resin coating has excellent thermal resistance and chemical resistance, and thus, the purge gas spraying plate exposed to fumes is prevented from being corroded or deformed.

In addition, since the fluoro-based resin coating is performed on the coupling surface, that is, the coupling portion, of the first plate 221 and the second plate 223, a purge gas is prevented from leaking from the flow path in which the coupling portion is formed. Types of the fluoro-based resin used for the fluoro-based resin coating include polytetrafluoroethylene (PTFE), polychlorotrifluoroethylene (PCTFE), polyvinylidene fluoride (PVDF), etc.

In addition, it is possible to use TEFLON® which is generally used by a general engineer as the fluoro-based resin coating.

Hereinafter, a fume removing apparatus 300 which includes the purge gas spraying plate 200 described above according to the first embodiment of the present invention will be described.

As illustrated in FIGS. 5 to 10, a fume removing apparatus 300 includes the main body 400 and the wafer cassette 500 having purge gas spraying plates 200.

The main body 400 includes a purge gas supplier configured to supply a gas into an inside of the wafer cassette 500, a purge gas discharger configured to discharge the discharged purge gas and fumes, and a controller configured to control the supply and discharge of the purge gas.

The wafer cassette 500 includes first wafer accommodating portions 510 configured to support wafers at the front end thereof, second wafer accommodating portions 530 configured to support the wafers at the rear end thereof, panels 550 configured to connect the first wafer accommodating portions 510 and the second wafer accommodating portions 530, and an exhaust 570 configured to exhaust a purge gas and fumes to the main body 400.

The first wafer accommodating portions 510 include the plurality of purge gas spraying plates 200, intermediate members 511 interposed between the plurality of purge gas spraying plates 200, coupling rods 513 configured to couple the purge gas spraying plates 200 and the intermediate members 511, heater rods 515 configured to heat the first wafer accommodating portions 510, and inflow paths 517 in which a purge gas flows, and are formed at left and right sides at the front end of the wafer cassette 500.

In this case, it is preferable that the number of the plurality of purge gas spraying plates 200 be in a range of twenty to thirty to form the first wafer accommodating portion 510 according to the number of wafers processed by the fume removing apparatus 300.

In addition, since the purge gas spraying plate 200 according to the first embodiment of the present invention has the structure and the effect described above, a duplicated description is omitted.

The inlet 230 and the first to third through holes 213 to 215 are formed in the intermediate member 511 by passing through the top surface and the bottom surface of the intermediate member 511 based on the purge gas spraying plate 200, and a coupling groove 216 is formed in a rear end portion of the intermediate member 511.

The length of the intermediate member 511 is shorter than that of the purge gas spraying plate 200, and the intermediate members 511 are interposed between the plurality of purge gas spraying plates 200.

One side surface of the intermediate member 511 is formed linearly, and the other side surface thereof is formed with a first inclined surface and a second inclined surface (not shown) the same as the other side of the plate 210 of the purge gas spraying plate 200 described above.

Thus, when the intermediate members 511 are coupled between the plurality of purge gas spraying plates 200, the other side surfaces of the intermediate members 511 and the purge gas spraying plates 200 are formed in the same surface shape, however, the one side surfaces of the intermediate members 511 are formed linearly and end portions of the one side surfaces thereof reach the other side surfaces of the purge gas spraying plates 200.

Thus, the concave portion 211 of the purge gas spraying plate 200 and the one side surface of the intermediate member 511 have an interval S therebetween as illustrated in FIG. 9.

In addition, the interval S is increased toward a front end of the purge gas spraying plate 200 due to the concave portion 211 having the circular arc shape. Thus, the interference between the intermediate member 511 and a wafer W may be prevented due to the interval S when the wafer is inserted into the inside of the wafer cassette 500.

The intermediate members 511 have a certain height h, clearance portions by which the purge gas spraying plates 200 stacked as a plurality are spaced apart from each other are formed due to the height h, and wafers may be easily loaded or unloaded from the inside of the wafer cassette 500 through the clearance portions.

In addition, since a spacing structure having the clearance portions has a heat sink shape, the thermal conductivity thereof is high when the first wafer accommodating portion 510 formed of a metal is heated by the heater rod 515 to be described below, and the spacing structure helps the temperature of the inside of the fume removing apparatus to be easily controlled by being easily cooled after heating the first wafer accommodating portion 510 is completed.

The coupling rods 513 are respectively inserted into the first and the third through holes 213 and 215 respectively formed in the purge gas spraying plate 200 and the intermediate member 511, and nuts are installed at both end portions of the coupling rods 513, to couple the plurality of purge gas spraying plates 200 and the intermediate members 511 together.

The heater rod 515 is inserted into the second through holes 214 respectively formed in the purge gas spraying plate 200 and the intermediate member 511 and heats the first wafer accommodating portion 510 to remove the humidity of the inside of the wafer cassette 500.

In addition, the heater rod 515 directly heats the first wafer accommodating portion 510 in a conductive manner, and a purge gas which flows at an inside of the purge gas spraying plate 200 is heated. Thus, the heater rod 515 helps the purge gas flow more actively in the flow path 270 and the like, and the purge gas may be easily sprayed.

The inflow path 517 is formed in a stack structure of inlets 230 formed in the intermediate member 511 and the purge gas spraying plate 200 as described above.

That is, the inlet 230 of the intermediate member 511 communicates with the inlet 230 formed in the purge gas spraying plate 200, and the plurality of inlets 230 form the inflow path 517 due to the stack structure of the plurality of the intermediate members 511 and the purge gas spraying plates 200.

The inflow path 517 supplies a purge gas supplied from the purge gas supplier of the main body 400 to paths 270 of the plurality of purge gas spraying plates 200.

In addition, since the inflow path 517 is formed with the plurality of the inlets 230, a purge gas may be leaked through coupling portions between the inlets 230, and in order to prevent this, it is preferable that the entire first wafer accommodating portion 510 formed by coupling the plurality of purge gas spraying plates 200 and the intermediate members 511 be coated with a fluoro-based resin.

The second wafer accommodating portions 530 are formed on left and right sides at the rear end of the wafer cassette 500.

In the second wafer accommodating portion 530, a plurality of support rods 290 are formed to support wafers inserted into the wafer cassette 500.

One end of the panel 550 is inserted into and coupled to coupling grooves 216 formed in the plurality of purge gas spraying plates 200 which configure the first wafer accommodating portion 510, and the other end thereof is coupled to the second wafer accommodating portion 530. Thus, the panels 550 are formed at the left and right of the center of the wafer cassette 500, that is, between the first wafer accommodating portion 510 and the second wafer accommodating portion 530.

The panel 550 prevents a purge gas and fumes in the inside of the wafer cassette 500 from being discharged to an outside thereof.

In addition, it is preferable that the panel 550 be formed of a transparent material such as an acryl or the like, and due to this, users may visually recognize that fumes remaining on wafers loaded inside the fume removing apparatus 300 are removed.

The exhaust 570 includes one side formed in a circular arc shape having the same curvature as a wafer W, and a plurality of holes are provided in the one side of the circular arc shape and disposed at the rear end of the wafer cassette 500, and the exhaust 570 exhausts a purge gas and fumes remaining inside the wafer cassette 500 to the purge gas discharger of the main body 400.

That is, as illustrated in FIGS. 7A and 7B, since the exhaust 570 in addition to the first wafer accommodating portion 510 described above have the one sides in which a purge gas flows, are formed in the circular arc shape, the left and right first wafer accommodating portions 510 surround left and right sides of the front end of the wafer W, the exhaust 570 surrounds the rear end surface of the wafer W, and the panels 550 also surround left and right sides of the rear end of the wafer W, a compact structure is formed.

Hereinafter, processes in which a robot arm transfers a wafer to the wafer cassette 500 and the fumes remaining on the wafer are removed by spraying a purge gas are described according to the configuration described above.

As illustrated in FIG. 7B, one sides of left and right intermediate members 511 are perpendicularly formed to a center line (the line shown as the diameter D in FIG. 7B) of the wafer W, and have a distance (hereinafter, referred to as L1) between each other.

The front portions 212 of the purge gas spraying plates 200 of the left and right first wafer accommodating portions 510 each are perpendicularly formed to the center line of the wafer W, and have a distance (hereinafter, referred to as L2) between each other.

The length of the L1 is longer than that of the diameter D of the wafer W, and the length of the L2 is shorter than that of the diameter D of the wafer W. That is, the lengths of the L1, L2, and D have a relation 'L1>D>L2'.

A robot arm loads the wafer W, and moves into the cassette 500 through a space, that is, the clearance portion formed between the plurality of stacked purge gas spraying plates 200, formed due to the height h of the intermediate member 511 described above, so that the robot arm inserts the wafer W thereinto.

In this case, since the distance L1 between the left and right sides intermediate members 511 is longer than the diameter D of the wafer, the wafer W may be easily inserted into the wafer cassette 500 without being interfered with by the intermediate member 511.

The robot arm moves into the wafer cassette 500, unloads the wafer W to be supported by the support rods 290 formed in the first wafer accommodating portions 510 and the second wafer accommodating portions 530, and moves out of the wafer cassette 500.

In this case, because of the distance L2 between the front portions 212 of the left and right purge gas spraying plates 200, the robot arm easily moves out of the wafer cassette 500 without being interfered with by the purge gas spraying plates 200.

The wafer W transferred by the robot arm is supported by the support rods 290 of the purge gas spraying plates 200 of the first wafer accommodating portions 510 at the left and right front ends of the wafer cassette 500 and the support rods 290 of the second wafer accommodating portions 530 of the left and right rear ends of the wafer cassette 500.

Thus, since the wafer W is supported by four support rods, the contact area thereof is minimized and the damage to the wafer W may be prevented.

In addition, so that a purge gas is sprayed easily, the wafer W and the concave portion 211 facing the wafer W have a spacing gap therebetween along the circular arc shape of the wafer W.

When all the wafers W are completely transferred into the wafer cassette 500, the purge gas controller installed at the main body 400 supplies a purge gas through the purge gas supplier.

The supplied purge gas flows through the inlet 230 to the flow path 270 of the purge gas spraying plate 200, the introduced purge gas is sprayed to the inside of the wafer cassette 500 through the first to fourth spraying holes 251 to 254.

The first and second spraying holes 251 and 252 formed at the concave portion 211 of the purge gas spraying plate 200 spray the purge gas toward the wafer W, and the third and fourth spraying holes 253 and 254 formed at the front portion 212 spray a purge gas toward the front end of the wafer W.

Particularly, in the case of a purge gas sprayed from the fourth spraying hole 254, since the purge gas is sprayed toward an entrance through which the wafer W enters, the purge gas may act as an air curtain which prevents a harmful gas existing at an outside thereof from entering the fume removing apparatus 300 during the wafer process.

The purge gas sprayed as described above flows with fumes remaining on a surface of the wafer toward the exhaust 570 at the rear end of the wafer cassette 500, and is discharged to the purge gas discharger of the main body 400 through a plurality of holes provided in the exhaust 570.

That is, the purge gases discharged from the front end of the wafer cassette 500 flow toward the rear end thereof due to the exhaust 570 at the rear end thereof.

The flow of the purge gas described above is performed for each of the wafers in the wafer cassette 500.

In addition, as illustrated in FIG. 8, since the first to fourth spraying holes 251 to 254 of the purge gas spraying plate 200 described above are formed lower than the support rod 290, the purge gas is actually sprayed to a bottom surface of the wafer supported by the purge gas spraying plate 200.

In this case, generally, since a surface of a wafer required to be cleaned is an upper surface rather than the bottom surface, each purge gas spraying plate 200 cleans a wafer supported by the purge gas spraying plate 200 just below itself rather than a wafer supported by itself.

In addition, as described above, the first to fourth branch flow paths 272 to 275 may be formed to be inclined downward so that a purge gas sprayed from the first to fourth spraying holes 251 to 254 of the purge gas spraying plate 200 can be sprayed in a direction of a downward slope.

In this case, since the amount of the purge gas which is sprayed from the first to fourth spraying holes 251 to 254 toward the wafer supported by the purge gas spraying plate stacked as a plurality is increased, fumes remaining on a surface of the wafer may be more effectively removed.

In addition, even when a wafer supported by a purge gas spraying plate 200 just below each purge gas spraying plate 200 is not presented, since a purge gas sprayed from the first to fourth spraying holes 251 to 254 is sprayed in a direction of a downward slope, the purge gas may be more effectively sprayed to the seated wafer to more effectively remove fumes remaining on a surface of the wafer.

While the example embodiments of the present invention and their advantages have been described above in detail, it should be understood that various changes, substitutions and alterations may be made thereto without departing from the scope of the invention as defined by the following claims.

What is claimed is:

1. A purge gas spraying plate, comprising:
   a plate including a concave portion formed at one side thereof;
   an inlet formed in the plate;
   a flow path which communicates with the inlet and is formed inside the plate;
   a plurality of spraying holes which communicate with the flow path and at least one of the plurality of spraying holes is formed in the concave portion, and
   a front portion configured to extend from an end portion of the concave portion and having a width decreasing toward a front of the plate,
   wherein the spraying holes are formed in plural number and the at least one of the plurality of spraying holes is formed in the front portion.

2. The plate of claim 1, wherein the plate is formed by assembling a first plate and a second plate formed in the same appearance as that of the first plate, and the flow path is formed in at least any one of surfaces of the first plate and the second plate which are coupled.

3. The plate of claim 2, further comprising:
   a coupling member configured to couple the first plate and the second plate; and
   an insulating film adhered on an upper surface of the coupling member.

4. The plate of claim 3, wherein a fluoro-based resin coating layer is formed on the plate.

5. The plate of claim 1, wherein the plurality of spraying holes spray a purge gas in a direction of a downward slope.

6. The plate of claim 1, wherein a support member configured to support a wafer is formed on the plate.

7. The plate of claim 6, wherein the support member is formed on the concave portion.

8. The plate of claim 1, wherein the flow path comprises a main flow path through which a gas introduced from the inlet flows, and a plurality of branch flow paths branched from the main flow path, wherein the plurality of branch flow paths respectively communicate with the plurality of spraying holes.

9. The plate of claim 8, wherein a cross-sectional area of the main flow path is greater than that of each of the plurality of branch flow paths.

10. The plate of claim 8, wherein a cross-sectional area of a branch flow path close to the inlet among the plurality of branch flow paths is smaller than that of a branch flow path farthest away from the inlet.

11. The plate of claim 8, wherein at least one obtuse angle is formed between the main flow path and the plurality of branch flow paths based on a direction in which the purge gas flows.

12. The plate of claim 8, wherein a branch flow path farthest away from the inlet among the plurality of branch flow paths and the main flow path form an obtuse angle based on a direction in which the purge gas flows.

13. The plate of claim 1, wherein the plate is formed by assembling a first metal plate and a second metal plate formed in the same appearance as that of the first metal plate, and the flow path is formed in at least any one of surfaces of the first metal plate and the second metal plate which are coupled, and an anodic oxide film is formed on the surfaces of the first metal plate and the second metal plate.

14. The plate of claim 13, wherein the plate is made of aluminum, and the anodic oxide film is an anodized layer formed by anodizing the aluminum.

15. The plate of claim 1, wherein the concave portion is formed in a circular arc shape.

16. A fume removing apparatus which removes fumes by spraying a purge gas on a wafer seated therein, the apparatus comprising a purge gas spraying plate of claim 1 configured to spray a purge gas on the wafer.

17. The apparatus of claim 16,
   wherein the purge gas spraying plate includes:
   a support member including one end coupled to one side and the other end configured to support the wafer,
   wherein the spraying holes spray a purge gas to the wafer in a state in which the spraying holes are spaced apart from the wafer.

18. The apparatus of claim 17,
   wherein the plate includes a plurality of plates, and the plurality of plates are vertically installed in the fume removing apparatus.

19. The apparatus of claim 18, wherein an intermediate member is interposed between the plurality of plates vertically installed.

20. The apparatus of claim 19, wherein the plurality of plates are formed to have longer lengths than that of the intermediate member, and a clearance portion, which is a gap between the plurality of plates disposed vertically, is formed.

21. The apparatus of claim 18, wherein a through hole is formed in each of the plurality of plates, and a heater rod is inserted in the through hole.

22. The apparatus of claim 18, wherein the plurality of plates are formed in front of the wafer, and an exhaust configured to exhaust the purge gas is formed at the rear of the wafer.

* * * * *